(12) United States Patent
Kim et al.

(10) Patent No.: US 8,598,568 B2
(45) Date of Patent: Dec. 3, 2013

(54) PHOTODETECTOR USING A GRAPHENE THIN FILM AND NANOPARTICLES, AND METHOD FOR PRODUCING THE SAME

(75) Inventors: Tae-Whan Kim, Seoul (KR); Jae-Hun Jung, Seoul (KR); Dong-Ick Son, Seoul (KR); Jung-Min Lee, Seoul (KR); Hee-Yeon Yang, Seoul (KR); Won-Il Park, Seoul (KR)

(73) Assignee: Industry-University Cooperation Foundation, Hanyang University, Seoul (KR)

( * ) Notice: Subject to any disclaimer, the term of this patent is extended or adjusted under 35 U.S.C. 154(b) by 118 days.

(21) Appl. No.: 13/392,176

(22) PCT Filed: Aug. 24, 2010

(86) PCT No.: PCT/KR2010/005631
§ 371 (c)(1),
(2), (4) Date: Feb. 24, 2012

(87) PCT Pub. No.: WO2011/025216
PCT Pub. Date: Mar. 3, 2011

(65) Prior Publication Data
US 2012/0161106 A1  Jun. 28, 2012

(30) Foreign Application Priority Data
Aug. 24, 2009 (KR) .................. 10-2009-0078054

(51) Int. Cl.
*H01L 31/0256*  (2006.01)

(52) U.S. Cl.
USPC .............. 257/29; 257/E31.003; 438/57

(58) Field of Classification Search
None
See application file for complete search history.

(56) References Cited

U.S. PATENT DOCUMENTS

2011/0070495 A1*  3/2011  Ban et al. .............. 429/221

FOREIGN PATENT DOCUMENTS

| | | |
|---|---|---|
| JP | 2008-205272 A | 9/2008 |
| KR | 2009-0043418 A | 5/2009 |
| KR | 2009-0057205 A | 6/2009 |

* cited by examiner

*Primary Examiner* — Seahvosh Nikmanesh
(74) *Attorney, Agent, or Firm* — William Park & Associates Patent Ltd.

(57) ABSTRACT

Provided are a photodetector (PD) using a graphene thin film and nanoparticles and a method of fabricating the same. The PD includes a graphene thin film having a sheet shape formed by means of a graphene deposition process using a vapor-phase carbon (C) source and a nanoparticle layer formed on the graphene thin film and patterned to define an electrode region of the graphene thin film, the nanoparticle layer being formed of nanoparticles without a matrix material. The PD has a planar structure using the graphene thin film as a channel and an electrode and using nanoparticles as a photovoltaic material (capable of forming electron-hole pairs due to photoelectron-motive force caused by ultraviolet (UV) light). Since the PD has a very simple structure, the PD may be fabricated at low cost with high productivity. Also, the PD includes the graphene thin film to reduce power consumption.

11 Claims, 8 Drawing Sheets

PHOTODETECTOR USING A GRAPHENE THIN FILM AND NANOPARTICLES, AND METHOD FOR PRODUCING THE SAME

TECHNICAL FIELD

The present invention relates to a photodetector (PD) and a method of fabricating the same, and more particularly, to a PD, which uses nanoparticles and has a planar structure, and a method of fabricating the same.

BACKGROUND ART

A photodetector (PD) is a device configured to detect an optical signal and convert the optical signal into an electrical signal. In particular, an ultraviolet (UV) PD has widely been used for various purposes in medical, industrial, and military fields. The UV PD is typically fabricated using silicon (Si). However, since silicon has a small energy bandgap, the lifespan of a device is shortened due to energy of visible (V) light, which is incident in addition to UV light. Also, a PD fabricated using silicon requires an additional filter configured to filter V light and infrared (IR) light.

To solve these problems, active research has been conducted on a technique of fabricating a PD using a material having a large energy bandgap, such as gallium nitride (GaN) and zinc oxide (ZnO). In particular, since ZnO has a large energy bandgap of about 3.35 eV, no additional V light filter is required. Also, since ZnO uses a material having low toxicity with respect to the human body, such as zinc, an environmentally friendly device may be fabricated. Various structures of UV PDs using ZnO have been studied. Most typically, a structure using a ZnO thin film, which is similar to a conventional PD, has been used. However, when a PD is fabricated using a ZnO thin film, it is difficult not only to grow a high-quality thin film capable of preventing current leakage but also to obtain a low-cost substrate having the same lattice constant as the ZnO thin film.

Due to the problems of the ZnO thin film, research on fabrication of a UV PD using ZnO structures, such as ZnO nanoparticles and ZnO nanowires, has been attempted. When the ZnO nanowires are used, the ZnO nanowires are disposed across a space between two electrodes. When light is incident, a depletion layer present in the ZnO nanowires is reduced due to electron-hole pairs formed in the ZnO nanowires, thereby increasing the electrical conductivity of the ZnO nanowires. When the ZnO nanoparticles are used, the ZnO nanoparticles are used as an electron transport material. Also, when light is incident, a depletion layer present in the ZnO nanoparticles is reduced due to electron-hole pairs formed in the ZnO nanoparticles, thereby increasing electrical conductivity.

A method of fabricating a PD using ZnO nanowires has high charge transport efficiency because the nanowires have a higher electrical conductivity than nanoparticles. However, the method has low operating efficiency because an effective area to which light is incident is smaller than a method using ZnO nanoparticles. Also, since it is very difficult to align the nanowires between specific electrodes, commercial production of PDs is not possible. To solve this problem, a method of adhering the ZnO nanoparticles to the ZnO nanowires may be used. However, a process of adhering the ZnO nanoparticles to the ZnO nanowires is complicated, and forming electrodes in the nanowires or forming the nanowires between the specific electrodes is still difficult.

In a process of fabricating a device using only ZnO nanoparticles, since a material for structurally fixing the nanoparticles is required, there are few cases where only the nanoparticles are used. In most cases, a structure in which the ZnO nanoparticles are included in a polymer is used. A method using a polymer including the ZnO nanoparticles may employ a process using a solvent, such as a spin coating process. However, the method using the polymer including the nanoparticles requires a transparent electrode or a transparent substrate as a stacked structure and further requires additional hole and electron transport layers in addition to a polymer layer configured to fix the nanoparticles.

As a method of fabricating a device using only ZnO nanoparticles without an additional matrix material, such as a polymer, a process of sintering the ZnO nanoparticles using an annealing process for fixing the ZnO nanoparticles may be considered. However, since the nanoparticles cling to one another during the sintering process, the device cannot be flexible. Also, since a high-temperature annealing process is required, a polymer substrate vulnerable to heat cannot be used. Furthermore, since a high voltage of about several tens of volts or higher should be applied due to a low electrical conductivity between the nanoparticles, the device cannot be used as a portable device.

DISCLOSURE

Technical Problem

The present invention is directed to a photodetector (PD) having a simple structure.

The present invention is also directed to a method of fabricating a PD more simply and economically.

Technical Solution

One aspect of the present invention provides a photodetector (PD), which includes a graphene thin film having a sheet shape formed by means of a graphene deposition process using a vapor-phase carbon (C) source and a nanoparticle layer formed on the graphene thin film and patterned to define an electrode region of the graphene thin film, the nanoparticle layer being formed of nanoparticles without a matrix material.

Another aspect of the present invention provides a method of fabricating a PD, which includes forming a graphene thin film by means of a graphene deposition process using a vapor-phase carbon source and forming a nanoparticle layer on the graphene thin film, the nanoparticle layer being patterned to define an electrode region of the graphene thin film and formed of nanoparticles without a matrix material.

Advantageous Effects

A photodiode (PD) according to the present invention has a planar structure using a graphene thin film as a channel and an electrode and using nanoparticles as a photovoltaic material. Since ultraviolet (UV) light is incident to a top end of the PD, a device may be fabricated even using an opaque device substrate.

In a PD fabricated according to the present invention, since a graphene thin film having a high electrical conductivity serves as both an electrode and a channel, it is unnecessary to form an additional charge transport layer and electrode. Also, when the graphene thin film is adhered onto a device substrate due to potent van der Waals force of graphene, no additional process or adhesive material is required. Furthermore, when nanoparticles are adhered onto the graphene thin film, the nanoparticles may be fixed without an additional polymer thin film used as a matrix material or without a process such as thermal treatment. Accordingly, since the PD has a very simple structure, the device may be fabricated at low cost with high productivity.

Since the PD includes the graphene thin film, excellent electrical performance may be expected. Since the graphene thin film having a high electrical conductivity is used as a channel, a sufficient amount of current for determining the presence or absence of UV light may be obtained even at a low voltage of about 3 V or lower. Since the graphene thin film has a high adhesive property, the PD including the graphene thin film has a high mechanical intensity. Since the graphene thin film having a good adhesive property is firstly adhered onto the device substrate, a device substrate formed of various materials may be used, and characteristics of the device vary within a small range according to the type of the device substrate. Since a nanoparticle layer is formed on the flexible graphene thin film, a lightweight, flexible PD may be fabricated using a flexible device substrate, such as a plastic substrate.

In particular, the graphene thin film may be formed using Joule heating by supplying current to at least one of a graphite metal layer and a substrate and heating the graphite metal layer with the generated electric heat. Since an electric field generated by the supplied current increases a grain size of the graphite metal layer to planarize the surface of the graphite metal layer, a graphene thin film having a high quality may be obtained.

By use of Joule heating, the generated amount of heat may be precisely controlled by adjusting the amount of current in a cooling step, which is the final step of a graphene process so that the cooling step may be performed at a precisely desired cooling speed. This is the most important factor that affects the quality of the formed graphene. Also, since the substrate is not indirectly heated due to radiant heat of a resistive heater or a lamp but directly heated due to Joule heating, the substrate may be scaled up at low cost without requiring the change of design of a heater.

In particular, according to the fabrication method of the present invention, nanoparticles may be simply formed at a temperature of about 100° C. or lower using a chemical method including mixing a metal acetate dihydrate with DMF and performing thermal treatment. Thus, the nanoparticles may be formed using a simple process without a high-priced apparatus. The formed nanoparticles have a uniform size and a very high density. Furthermore, since nanoparticles of a metal contained in the metal acetate dihydrate may be formed, nanoparticles of various kinds may be applied in various fields. By spin-coating the formed nanoparticles on the graphene thin film, a PD having a simple structure according to the present invention may be fabricated at low cost using a simple process.

BEST MODE FOR INVENTION

Figure 1:
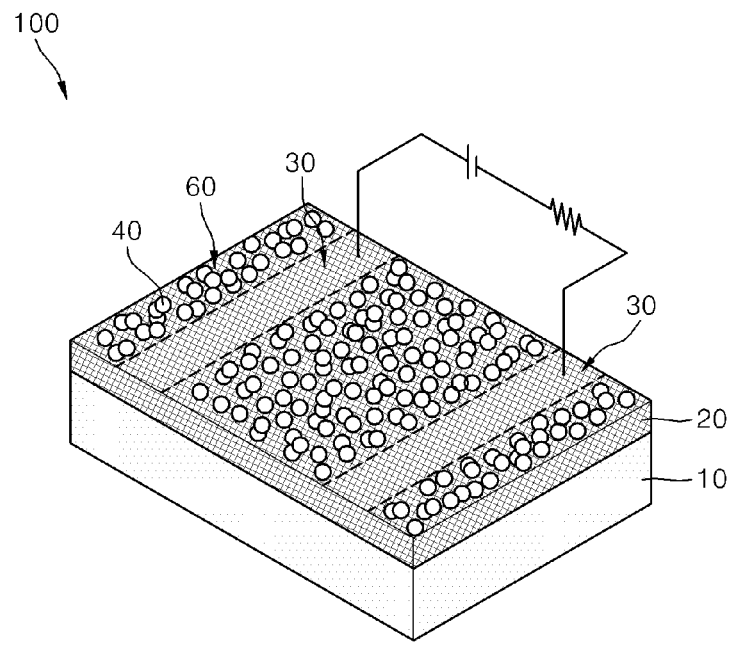
FIG. 1 is a schematic perspective view of a photodetector (PD) according to an embodiment of the present invention.

In a photodetector (PD) according to the present invention, the nanoparticles may be one selected from the group consisting of zinc oxide (ZnO), copper oxide (CuO), barium carbonate ($BaCO_3$), bismuth oxide ($Bi_2O_3$), boron oxide ($B_2O_3$), calcium carbonate ($CaCO_3$), cerium oxide ($CeO_2$), chromium oxide ($Cr_2O_3$), iron oxide ($Fe_2O_3$), gallium oxide ($Ga_2O_3$), indium oxide ($In_2O_3$), lithium carbonate ($Li_2CO_3$), lithium cobalt oxide ($LiCoO_2$), magnesium oxide (MgO), manganese carbonate ($MnCO_3$), manganese oxide ($MnO_2$), manganese tetroxide ($Mn_3O_4$), niobium oxide ($Nb_2O_5$), lead oxide (PbO), antimony oxide ($Sb_2O_3$), tin oxide ($SnO_2$), strontium carbonate ($SrCO_3$), tantalum oxide ($Ta_2O_5$), titanium oxide ($TiO_2$), barium titanate ($BaTiO_3$), vanadium oxide ($V_2O_5$), tungsten oxide ($WO_3$), zirconium oxide ($ZrO_2$), gallium nitride (GaN), aluminum gallium nitride ($Al_xGa_{1-x}N$), silicon carbide (SiC), and zinc sulfide (ZnS).

In the method of fabricating the PD according to the present invention, the formation of the nanoparticle layer may include preparing a solution in which nanoparticles are dispersed, spin-coating the solution, in which the nanoparticles are dispersed, on the graphene thin film and drying the solution to form the nanoparticle layer, and patterning the nanoparticle layer to define an electrode region of the graphene thin film. Alternatively, the formation of the nanoparticle layer may include preparing a solution in which nanoparticles are dispersed, forming a mask covering the electrode region of the graphene thin film on the graphene thin film, spin-coating the solution, in which the nanoparticles are dispersed, on the graphene thin film on which the mask is formed and drying the solution to form the nanoparticle layer, and removing the mask.

In particular, the preparation of the solution in which the nanoparticles are dispersed may include dissolving a metal acetate dihydrate in N,N-dimethyl formamide (DMF) to form a mixture solution, heating the mixture solution, and gradually dropping a heating temperature to form the nanoparticles.

In the method of fabricating the PD according to the present invention, the formation of the graphene thin film may include loading a substrate on which a graphite metal layer is formed, into a chamber, supplying current to at least one of the graphite metal layer and the substrate in the chamber and heating the graphite metal layer with generated electric heat, supplying a vapor-phase carbon source into the chamber during the heating of the graphite metal layer to solidly dissolve a carbon component in the graphite metal layer, cooling off the graphite metal layer at a controlled speed by controlling the amount of the current to educe graphene from the solidly dissolved carbon component on a surface of the graphite metal layer, and removing the graphite metal layer using acidic processing to separate the educed graphene from the substrate.

Mode for Invention

Hereinafter, embodiments of the present invention will be described in detail. However, the present invention is not limited to the embodiments disclosed below, but can be implemented in various types. Therefore, the present embodiments are provided for complete disclosure of the present invention and to fully inform the scope of the present invention to those ordinarily skilled in the art.

Figure 2:
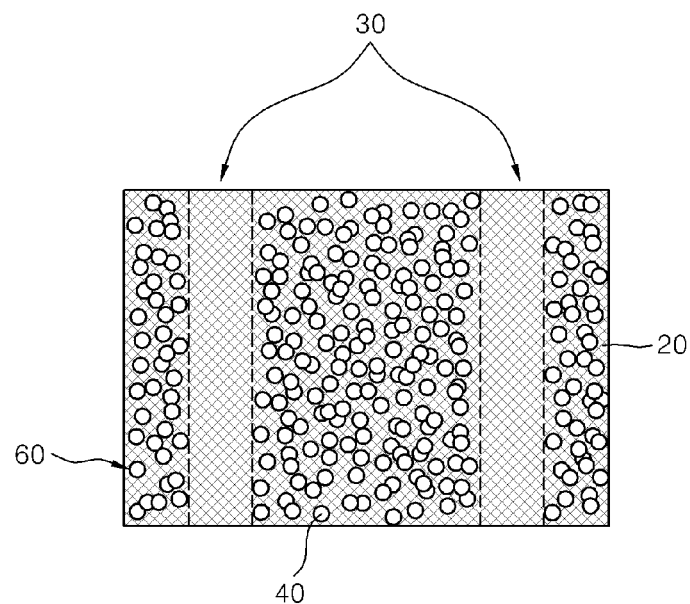
FIGS. 2 and 3 are a top view and a cross-sectional view of the PD, respectively.
Figure 3:
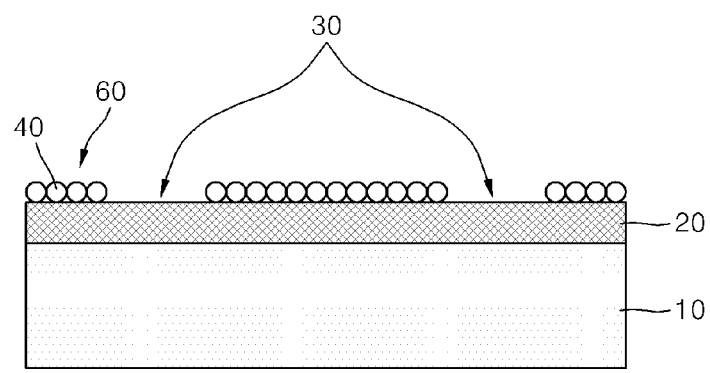

The present invention provides a photodetector (PD) having a new planar structure in which a graphene thin film is used as an electrode and a channel and nanoparticles are used as a photovoltaic material and adhered onto the graphene thin film without an additional matrix material. FIG. 1 is a schematic perspective view of a PD according to an embodiment of the present invention. FIGS. 2 and 3 are a top view and a cross-sectional view of the PD, respectively.

Referring to FIGS. 1 through 3, a PD 100 according to the present invention includes only a graphene thin film 20 and a nanoparticle layer 60 disposed on a device substrate 10. The graphene thin film 20 is characterized by being formed by adhering a graphene thin film having a sheet shape obtained by a graphene deposition process using a vapor-phase carbon source onto the device substrate 10. The nanoparticle layer 60 is characterized by being patterned to define an electrode region 30 of the graphene thin film 20 and including only nanoparticles 40 without an additional matrix material serving as a fixing material. As shown in FIG. 1, an external circuit (a power source and a resistor) is connected to the electrode region 30.

In the PD 100 according to the present invention, the graphene thin film 20 is used as a channel and an electrode, and the nanoparticle layer 60 is used as a photovoltaic material (capable of forming electron-hole pairs due to photoelectromotive force caused by UV light). Since current flows along a horizontal plane of the graphene thin film 20 in the PD 100, the PD 100 has a planar structure rather than a vertical stacked structure. Since UV light is incident to a top end of the PD 100, even if an opaque substrate is used as the device substrate 10, fabrication of the PD 100 may be enabled.

Graphene is a material in which carbon atoms are 2-dimensionally combined with one another like graphite and is formed as a single layer or a double or triple layer to a very small thickness unlike graphite. Graphene is flexible and transparent and has a very high electrical conductivity. Since the PD 100 according to the present invention employs the graphene thin film 20 having a high electrical conductivity as a channel and an electrode, it is unnecessary to form an additional charge transport layer and an additional electrode. Also, a sufficient amount of current for determining the presence or absence of UV light may be obtained even at a low voltage of about 3 V or lower.

The graphene thin film 20 is also effectively adhered onto the device substrate 10 with no additional process or adhesive material due to a potent van der Waals force. Similarly, the nanoparticle layer 60 is effectively fixed onto the graphene thin film 20 without an additional polymer thin film used as a matrix material or an additional process, such as thermal treatment. That is, it is unnecessary to interpose other materials, such as a layer configured to facilitate transport of charges and a layer configured to facilitate fastness of a material, between the device substrate 10 and the graphene thin film 20 and between the graphene thin film 20 and the nanoparticle layer 60. When the configuration of the graphene thin film 20 and the nanoparticle layer 60 satisfies a predetermined thickness and mechanical intensity, the device substrate 10 itself may be omitted. Thus, since the PD 100 may include only the graphene thin film 20 and the nanoparticle layer 60 and be structurally very simple, a device may be fabricated at low cost with high productivity.

Although the graphene thin film 20 may be insulated to enable electrical insulation of the graphene thin film 20 from adjacent cells, the graphene thin film 20 is not patterned within one cell unlike shown in the drawings, but only the nanoparticle layer 60 formed thereon is patterned. It is very difficult to align a nanostructure between two electrodes in a conventional device using a nanostructure. However, a PD structure according to the present invention is free from the above-described problems.

The device substrate 10 may be a transparent inorganic substrate formed of, for example, glass, quartz, aluminum oxide ($Al_2O_3$), or silicon carbide (SiC), a transparent organic substrate formed of, for example, polyethylene terephthalate (PET), polystyrene (PS), polyimide (PI), polyvinyl chloride (PVC), polyvinyl pyrrolidone (PVP), or polyethylene (PE), or a substrate formed of, for example, Si, gallium arsenide (GaAs), indium phosphide (InP), indium antimonide (InSb), aluminum arsenide (AlAs), aluminium antimonide (AlSb), cadmium telluride (CdTe), zinc telluride (ZnTe), zinc sulfide (ZnS), cadmium selenide (CdSe), cadmium selenide (CdSb), or gallium phosphide (GaP). In addition, since the fabrication method does not need a high-temperature process, as will be described later, the device substrate 10 may include a material susceptible to heat, such as paper or vinyl. Furthermore, when a transparent substrate is used as the device substrate 10, since incident light may be incident to both top and bottom ends of the PD 100, the incident amount of light may be increased to increase photovoltaic efficiency. By use of a plastic substrate, such as PET, the PD 100 may be fabricated as a flexible device.

The nanoparticles 40 may be one selected from the group consisting of zinc oxide (ZnO), copper oxide (CuO), barium carbonate ($BaCO_3$), bismuth oxide ($Bi_2O_3$), boron oxide ($B_2O_3$), calcium carbonate ($CaCO_3$), cerium oxide ($CeO_2$), chromium oxide ($Cr_2O_3$), iron oxide ($Fe_2O_3$), gallium oxide ($Ga_2O_3$), indium oxide ($In_2O_3$), lithium carbonate ($Li_2CO_3$), lithium cobalt oxide ($LiCoO_2$), magnesium oxide (MgO), manganese carbonate ($MnCO_3$), manganese oxide ($MnO_2$), manganese tetroxide ($Mn_3O_4$), niobium oxide ($Nb_2O_5$), lead oxide (PbO), antimony oxide ($Sb_2O_3$), tin oxide ($SnO_2$), strontium carbonate ($SrCO_3$), tantalum oxide ($Ta_2O_5$), titanium oxide ($TiO_2$), barium titanate ($BaTiO_3$), vanadium oxide ($V_2O_5$), tungsten oxide ($WO_3$), zirconium oxide ($ZrO_2$), gallium nitride (GaN), aluminum gallium nitride ($Al_xGa_{1-x}N$), silicon carbide (SiC), and zinc sulfide (ZnS). A PD having a desired wavelength may be used according to the energy bandgap of a selected material. For example, when the nanoparticles 40 are ZnO nanoparticles, the PD 100 may be used as a UV PD.

Figure 4:
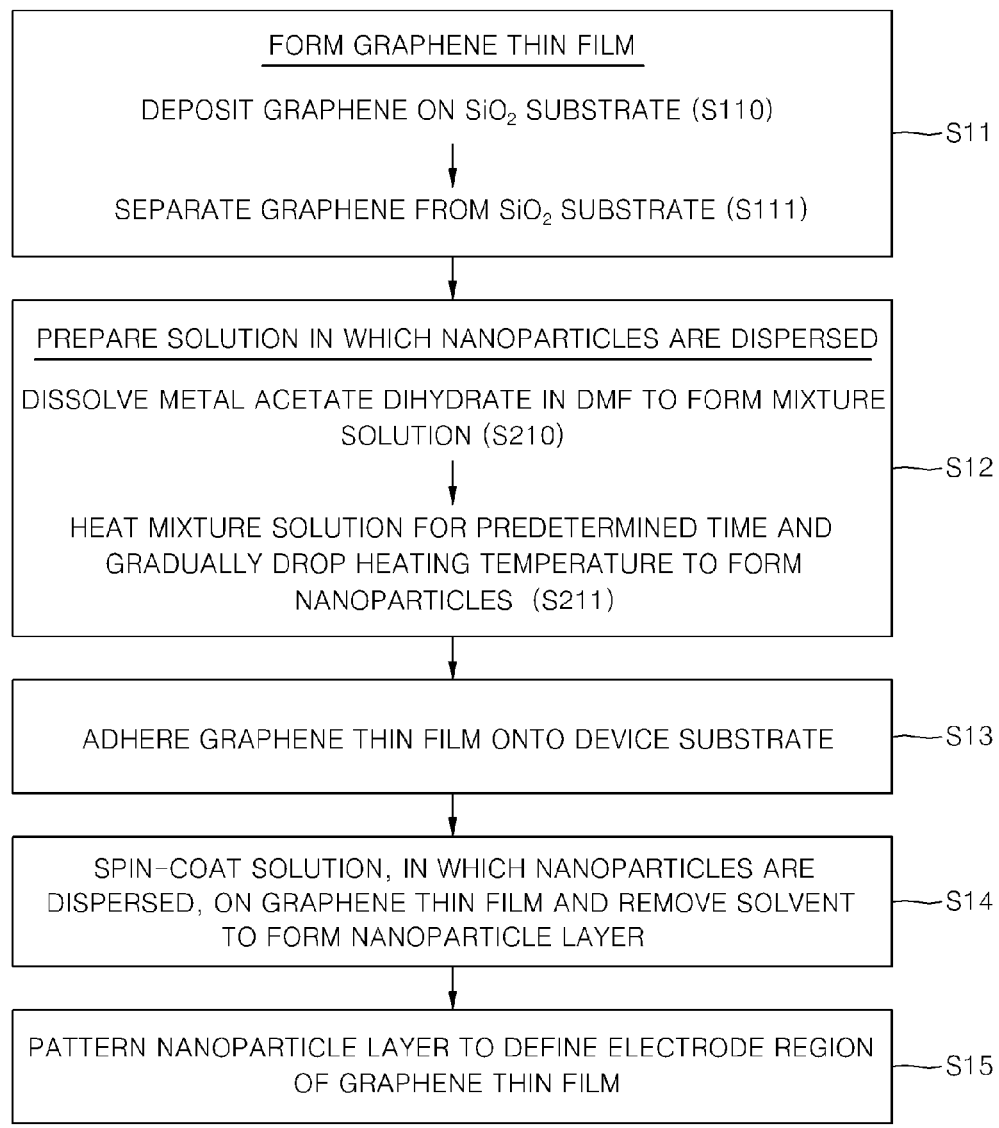
FIG. 4 is a flowchart illustrating a method of fabricating a PD according to an embodiment of the present invention.
Figure 5:
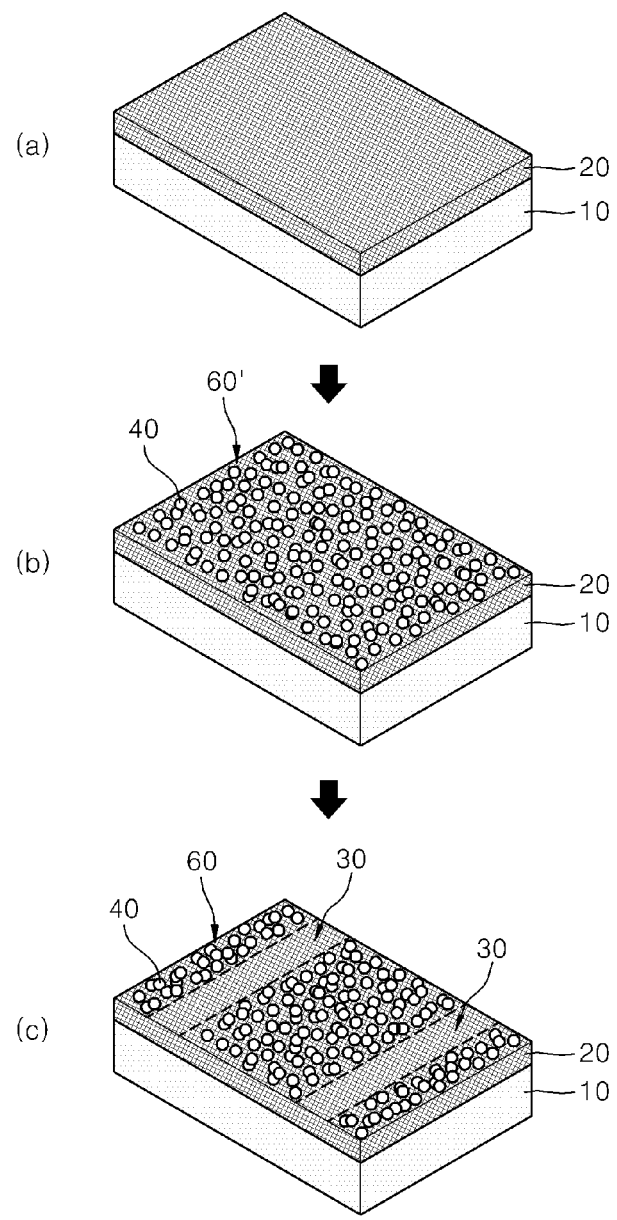
FIG. 5 is a process cross-sectional view corresponding to the flowchart of FIG. 4.

FIG. 4 is a flowchart illustrating a method of fabricating a PD according to an embodiment of the present invention, and FIG. 5 is a process cross-sectional view corresponding to the flowchart of FIG. 4. The method of fabricating the PD 100 shown in FIG. 1 will be described in detail with reference to FIGS. 4 and 5.

To begin with, a graphene thin film having a sheet shape to be used as a transparent electrode is formed (step S11 of FIG. 4).

Initially, graphene is adhered onto a $SiO_2$ substrate (step S110). To this end, a $SiO_2$ substrate on which nickel (Ni) is deposited is loaded into a chemical-vapor-deposition (CVD) chamber, and hydrogen ($H_2$) and argon (Ar) gases are mixed in an appropriate ratio of, for example, 1:4, and injected into the CVD chamber. $CH_4$ gas serving as a vapor-phase carbon source and the $H_2$—Ar mixture gas are injected into the CVD chamber at a high temperature for a predetermined time of about 30 seconds while maintaining a predetermined atmospheric pressure, and the CVD chamber is slowly cooled off to room temperature. During this process, graphene is grown on Ni.

Next, the grown graphene is separated from the $SiO_2$ substrate (step S111). To this end, the $SiO_2$ substrate is sequentially put in a hydrogen fluoride (HF) solution and a Ni etchant to etch $SiO_2$ and Ni. Thus, the graphene is educed as the type of a thin film and completely separated. A TFB or TFG solution may be used as the Ni etchant.

Conventional methods of forming a graphene thin film for a transparent electrode are divided into a method of forming a thin film by refining graphite using a catalyst and a wet method using graphene oxide. The method of forming the graphene thin film by refining graphite includes coating a catalyst on graphite adhered onto a substrate, covering the resultant structure with a polymer, obtaining graphene from the graphite using thermal treatment, and removing the substrate to obtain the graphene thin film. The wet method using graphene oxide includes oxidizing graphene, mixing the oxidized graphene with a solution and dispersing the oxidized graphene in the solution, and directly forming an electrode or an electron transport layer by spin-coating the solution.

Although a high-quality graphene thin film may be obtained using the method using the graphite and the catalyst, the forming process is quite complicated. The method using the oxidized graphene is simpler than the method of refining the graphite. However, when the oxidized graphene is used, electrical properties are degraded as compared with a case where pure graphene is used. Also, since a graphene thin film is formed not as a single thin film but as small pieces, characteristics of a transparent electrode are degraded as compared with those of a conventional indium tin oxide (ITO) electrode.

However, according to the method of the present invention in which a graphene thin film having a sheet shape is formed by graphene deposition using a vapor-phase carbon source, graphene may be obtained using a simple vapor-phase deposition process, such as a CVD process, the forming process is simple, and the formed graphene thin film has a good quality.

Next, a solution in which nanoparticles are dispersed is prepared (step S12).

Initially, a metal acetate dihydrate is dissolved in N,N-dimethyl formamide (DMF) to form a mixture solution (step S210).

The metal acetate dihydrate is a compound expressed by $M(CH_3COO)_2 \cdot 2H_2O$ (here, M is a metal). The metal may be at least one selected from the group consisting of Zn, Al, Ba, Bi, Ca, Ce, Cr, Fe, Ga, In, Li, Co, Mg, Mn, Nb, Pb, Sb, Sn, Sr, Ta, Ti, V, W, and Zr.

Next, the mixture solution is heated for a predetermined time, and then a heating temperature is gradually dropped to form nanoparticles in the mixture solution (step S211). The nanoparticles may be formed at a relatively low temperature of about 100° C. After heating the mixture solution, it is necessary to gradually drop the heating temperature without rapidly cooling off the mixture solution. In this case, the formed nanoparticles may include a metal oxide. The metal oxide may be one of zinc oxide (ZnO), copper oxide (CuO), barium carbonate ($BaCO_3$), bismuth oxide ($Bi_2O_3$), boron oxide ($B_2O_3$), calcium carbonate ($CaCO_3$), cerium oxide ($CeO_2$), chromium oxide ($Cr_2O_3$), iron oxide ($Fe_2O_3$), gallium oxide ($Ga_2O_3$), indium oxide ($In_2O_3$), lithium carbonate ($Li_2CO_3$), lithium cobalt oxide ($LiCoO_2$), magnesium oxide (MgO), manganese carbonate ($MnCO_3$), manganese oxide ($MnO_2$), manganese tetroxide ($Mn_3O_4$), niobium oxide ($Nb_2O_5$), lead oxide (PbO), antimony oxide ($Sb_2O_3$), tin oxide ($SnO_2$), strontium carbonate ($SrCO_3$), tantalum oxide ($Ta_2O_5$), titanium oxide ($TiO_2$), barium titanate ($BaTiO_3$), vanadium oxide ($V_2O_5$), tungsten oxide ($WO_3$), and zirconium oxide ($ZrO_2$). Also, the density and size of the formed nanoparticles may be varied by controlling a ratio of DMF to the metal acetate dihydrate, the heating temperature, and a heating time.

The solution in which the nanoparticles are dispersed may be easily prepared using steps S210 and S11. Since any metal present in the metal acetate dihydrate may form nanoparticles using the above-described method, various PDs may be fabricated. When nanoparticles, such as GaN, $Al_xGa_{1-x}N$, SiC, and ZnS, are used rather than the metal oxide nanoparticles, the nanoparticles are obtained and dispersed in an appropriate solvent to prepare the solution in which the nanoparticles are dispersed.

Subsequently, to fabricate the PD 100 having the structure shown in FIG. 1, the graphene thin film 20 formed in step 11 is adhered onto the device substrate 10 (step S13, refer to (a) of FIG. 5). The graphene thin film 20 is easily adhered onto the device substrate 10 due to van der Waals force, and no additional adhesive material or process is required for the adhesion process.

Next, the solution in which the nanoparticles are dispersed, which is prepared in step S12, is spin-coated on the graphene thin film 20. By performing a drying process, for example, by applying heat to the spin-coated solution to remove the solvent, a nanoparticle layer 60' including nanoparticles 40 may be formed without a matrix material (step S14, refer to (b) of FIG. 5). The nanoparticles 40 are effectively adhered onto the graphene thin film 20 due to van der Waals force between the graphene thin film 20 and the nano particles 40 without an additional adhesive material or process. When the graphene thin film 20 has a small area, the nanoparticle layer 60' may be formed using only an education process without a spin coating process. Since the nanoparticles 40 are adhered to the graphene thin film 20 due to van der Waals force to form the nanoparticle layer 60', the nanoparticle layer 60' may be formed as a single layer or a double or triple layer to a small thickness as shown.

Next, the nanoparticle layer 60' is patterned to define the electrode region 30 of the graphene thin film 60, thereby completing the nanoparticle layer 60 (step S15, refer to (c) of FIG. 5). Also, an external circuit is connected as shown in FIG. 1, thereby completing fabrication of the PD 100. The external circuit is connected to the electrode region 30 of the graphene thin film 60. To form contact terminals required for the connection of the external circuit, some of the nanoparticles 40 forming the nanoparticle layer 60' are patterned by etching.

Meanwhile, the present embodiment exemplarily describes a method of blank forming the nanoparticle layer 60' on the graphene thin film 20 and selectively removing the nanoparticles 40 from the electrode region 30 to obtain the patterned nanoparticle layer 60. However, the nanoparticle layer 60' may be formed using a so-called lift-off process, which is typically applied to a metal electrode forming process. That is, a mask (not shown) covering the electrode region 30 is initially formed on the graphene thin film 20 using a material such as photoresist, and a solution in which nanoparticles are dispersed is spin-coated on the mask and dried, and the mask is removed. As a result, the nanoparticles formed on the mask are removed along with the mask, so that the nanoparticle layer 60, which is patterned to remove the nanoparticles from the electrode region 30, may be obtained.

According to the method of the present invention, since the graphene thin film 20 having a high adhesive property is firstly adhered onto the device substrate 10, a substrate formed of various materials may be used, and characteristics of a device vary within a small range according to the type of a substrate. Since the nanoparticles 40 are formed on the flexible graphene thin film 20, a lightweight, flexible PD may be fabricated using a flexible substrate, such as a plastic substrate.

In particular, according to the method of the present invention, nanoparticles may be simply formed using a chemical method at a temperature of about 100° C. including mixing a metal acetate dihydrate with DMF and performing thermal treatment, a high-priced apparatus is not needed and the forming process is simple. The formed nanoparticles have a uniform size and a very high density. Furthermore, since nanoparticles of a metal contained in the metal acetate dihydrate may be formed, nanoparticles of various kinds may be applied in wide fields. The formed nanoparticles are simply spin-coated on the graphene thin film and dried so that a PD having a simple structure according to the present invention may be fabricated.

Although the present embodiment describes a method of forming a graphene thin film by growing graphene on a $SiO_2$ substrate on which Ni is deposited, a substrate serving as a base unit configured to form the graphene thin film is not necessarily limited to the $SiO_2$ substrate. Also, the growth of graphene may be typically performed using a typical CVD process. However, when a method to be described later is used, a high-quality graphene thin film may be obtained, and the quality of a PD using the high-quality graphene thin film as an electrode may be improved. Thus, a method of growing a graphene thin film according to an embodiment will be described in detail.

Figure 6:
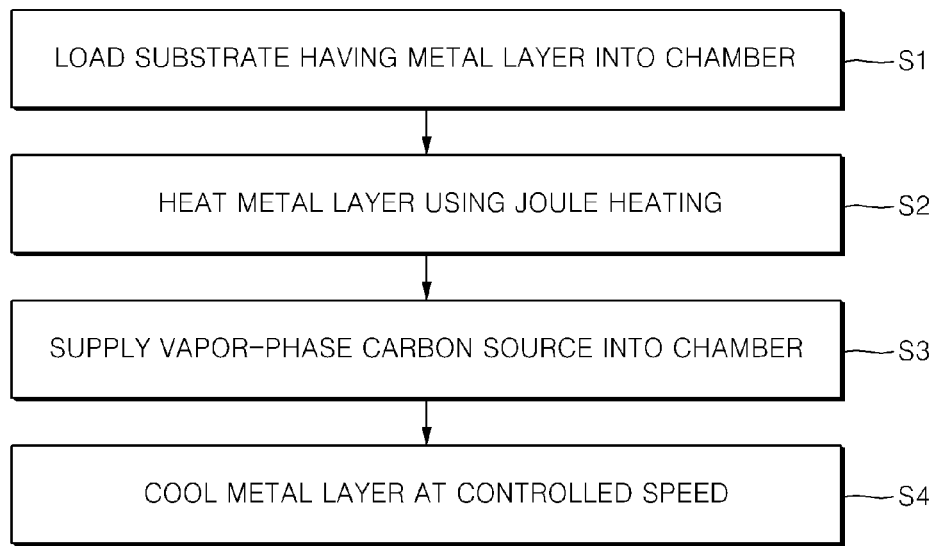
FIG. 6 is a flowchart illustrating a process of forming a graphene thin film used for fabrication of a PD according to an embodiment of the present invention.
Figure 7:
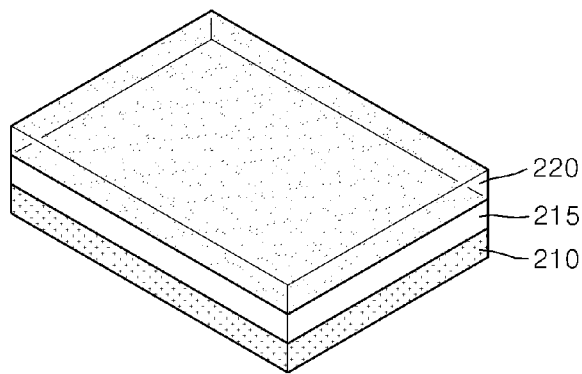
FIGS. 7 through 9 are schematic diagrams corresponding to the flowchart of FIG. 6.
Figure 8:
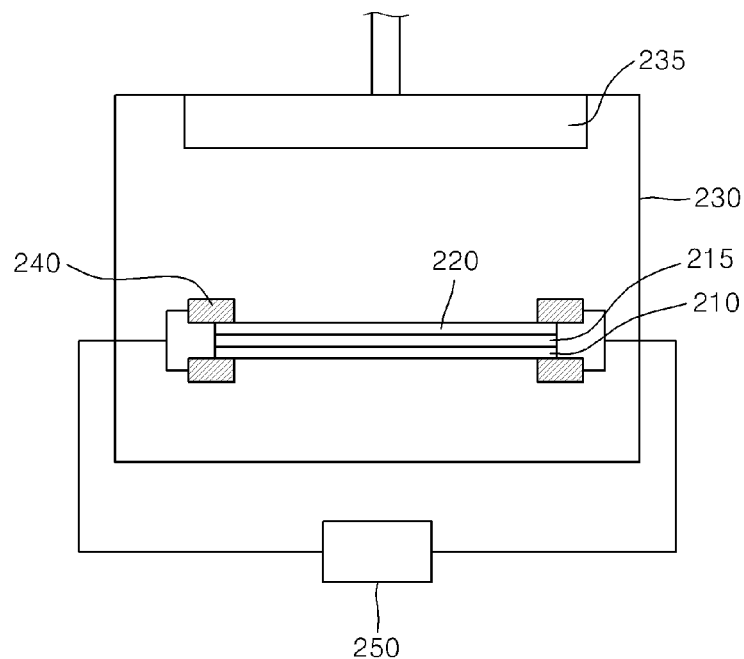
Figure 9:
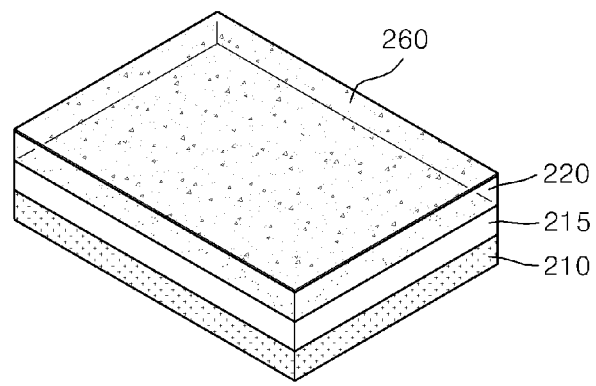

FIG. 6 is a flowchart illustrating a process of forming a graphene thin film used for fabrication of a PD according to an embodiment of the present invention, and FIGS. 7 through 9 are schematic diagrams corresponding to the flowchart of FIG. 6.

To begin with, a substrate 210 on which a graphite metal layer 220 is formed is prepared as shown in FIG. 7, and loaded into a chamber 230 as shown in FIG. 8 (refer to step S1 of FIG. 6).

Here, a gas supply device 235 capable of supplying various gases to a side of the substrate 210 to enable a CVD process is basically installed in the chamber 230. The gas supply device 235 may include, for example, a shower head used as a gas supply device of an apparatus of a similar kind to the chamber 230, but the gas supply device 235 of the present invention is not limited thereto. After the substrate 210 on which the graphite metal layer 220 is formed is loaded into the chamber 230, the air is exhausted from the chamber 230 using a pump (not shown). Thereafter, while maintaining the inside of the chamber 230 by a vacuum, appropriate atmosphere gases, for example, $H_2$ gas and Ar gas, are mixed in a ratio of 1:1 to 1:6 and injected through the gas supply device 235 to maintain an atmospheric pressure.

The substrate 210, which is a subsidiary unit configured to form a graphene thin film, may be formed of any material, which may resist a subsequent heating process performed at a temperature of about 1000° C. and be easily removed using acidic processing to obtain a graphene thin film having a sheet shape separated from the substrate 210. In the present embodiment, a doped or undoped silicon substrate is adopted as the substrate 210 that satisfies the above-described properties and is inexpensive and easily obtainable. A silicon oxide layer 215 is formed on the doped or undoped silicon substrate, and a graphite metal layer 220 is formed thereon.

The graphite metal layer 220 may include a metal graphite catalyst, which aids combination of carbon components to form a hexagonal sheet structure. For example, a catalyst used to synthesize graphite, induce a carbonization reaction, or form carbon nanotubes, may be used as the metal graphite catalyst. More specifically, the metal graphite catalyst may be at least one metal selected from the group consisting of Ni, Co, Fe, Pt, Au, Al, Cr, Cu, Mg, Mn, Mo, Rh, Si, Ta, Ti, W, U, V, Zr and alloys thereof.

The formation of the graphite metal layer 220 may include dissolving a complex of the metal or alkoxide of the metal in a solvent, such as alcohol, coating an obtained solution on the substrate 210, and drying the solution. Alternatively, the graphite metal layer 220 may be deposited on the substrate 210 using a metal deposition method, such as a thermal deposition method.

In particular, electrodes 240 are installed near both ends of the substrate 210 in the chamber 230 used in the present embodiment. An external power source 250 (a direct-current (DC) or alternating-current (AC) power source) is connected to the electrodes 240. Thus, when the electrodes 240 are brought into contact with the substrate 210 on which the graphite metal layer 220 is formed, as shown in FIG. 7, current may be supplied through the graphite metal layer 220 when the substrate 210 is an insulating substrate, such as an undoped silicon substrate, while current may be supplied through at least one of the metal graphite metal layer 220 and the substrate 210 when the substrate 210 is a conductive substrate, such as a doped silicon substrate. Although the electrodes 240 shown in FIG. 7 are two pairs of electrodes that are installed at both top and bottom ends of the substrate 210 and extend along two opposite sides of the substrate 210, the shape of the electrodes 240 is not limited thereto and may have any structure capable of enabling the graphite metal layer 220 and/or the substrate 210 to be uniformly electrically conductive.

Next, current is supplied to at least one of the graphite metal layer 220 and the substrate 210 in the chamber 230 while maintaining the atmospheric pressure, and the graphite metal layer 220 is heated with the generated electric heat (step S2 of FIG. 6). That is, a temperature of the graphite metal layer 220 is raised using Joule heating. Preferably, the graphite metal layer 220 is heated to a temperature of about 600° C. to about 1000° C. In this case, a grain size of the graphite metal layer 220 is increased due to a heating effect to planarize the surface of the graphite metal layer 220.

As mentioned above, by bringing the electrodes 240 inside the chamber 230 into contact with the substrate 210, current may be supplied to the graphite metal layer 220 and/or the substrate 210 so that the graphite metal layer 220 can be heated with the generated electric heat. When the substrate 210 is an insulating substrate, the graphite metal layer 220 is electrically conductive and directly generates heat to raise the temperature of the graphite metal layer 220. Since the metal catalyst is formed as the type of thin film and the electrodes 240 are in contact with the both ends of the substrate 210, current may be nearly uniformly supplied to the entire surface of the graphite metal layer 220. Thus, only by supplying current to the graphite metal layer 220, is the entire graphite metal layer 220 nearly uniformly heated due to electrical heating without a complicated control operation to raise the temperature of the graphite metal layer 220. When the substrate 210 is a conductive substrate, by applying current to the substrate 210, the substrate 210 generates heat to easily heat the graphite metal layer 220 formed on the substrate 210.

In this step, a grain size of a metal forming the graphite metal layer 220 may be increased due not only to a heating effect but also to an additional effect caused by an electrical field generated by the supplied current. Thus, the surface of the graphite metal layer 220 is greatly planarized. Since graphene is formed on the planarized graphite metal layer 220 during a subsequent process, the quality of the graphite metal layer 220 is improved.

Next, a vapor-phase carbon source is supplied into the chamber 230 through the gas supply device 235 while heating the graphite metal layer 220, so that a carbon component is solidly dissolved in the graphite metal layer 220 (step S3 of FIG. 6).

The vapor-phase carbon source may be a hydrocarbon-based gas, such as ethane, ethylene, ethanol, acetylene, propane, propylene, butane, butadiene, pentane, or hexane. In particular, the vapor-phase carbon source may include $CH_4$ gas, and hydrogen may be further supplied along with the vapor-phase carbon source. In other words, $CH_4$ gas may be supplied as the vapor-phase carbon source in the current step while continuously supplying a mixture of $H_2$ gas and Ar gas to maintain the atmospheric pressure of the chamber 230. In the current step, the amount of the carbon component solidly dissolved in the graphite metal layer 220 may be controlled by adjusting a heating temperature, a heating time, and the supplied amount of the vapor-phase carbon source. When the amount of the solidly dissolved carbon component is increased by increasing the heating time and the supplied amount of the vapor-phase carbon source, the thickness of the graphene thin film may be increased. Conversely, when the amount of the solidly dissolved carbon component is reduced by reducing the heating time and the supplied amount, the thickness of the graphene thin film may be reduced. When the supplied amount is small, a desired amount of a carbon component may be solidly dissolved by increasing the heating time.

In general, a substrate to be heated is processed using a method of indirectly heating the substrate due to radiant heat of a resistive heater or a lamp. In recent years, due to the scaling-up of thin-film displays or the increased demand of inexpensive solar cell panels, scaling up of a graphene thin film for a transparent electrode has become necessary. To obtain a large-sized graphene thin film, the substrate 210 serving as a base on which the graphene thin film is formed should be scaled up. However, since a heater also needs to be scaled up in the conventional method of indirectly heating the substrate due to radiation using a resistive heater or a lamp, the cost of fabrication is likely to increase.

However, since the substrate 210 and/or the graphite metal layer 220 are electrically conductive and are directly heated using Joule heating, a heating process may be efficiently performed using a simple configuration without increasing the cost of fabrication, and the graphite metal layer 220 may be heated not only when the substrate 210 is an insulating substrate but also when the substrate 210 is a conductive substrate.

Next, the supply of the vapor-phase carbon source is stopped and the amount of current supplied due to Joule heating is reduced so that the graphite metal layer 220 can be cooled off at a controlled speed (step S4 of FIG. 6). Thus, graphene is educed on the metal graphite layer 220 from the carbon component solidly dissolved in the graphite metal layer 220 and a graphene thin film 260 is formed on the surface of the graphite metal layer 220 as shown in FIG. 9.

The cooling process is an important step for uniformly educing the graphene to obtain a high-quality graphene thin film 260. A rapid cooling process may cause formation of graphene to a thickness less than a desired thickness or occurrence of cracks in the generated graphene thin film. A slow cooling process may cause formation of graphene to an excessively great thickness or reduce productivity. Thus, the cooling process may be performed at a controlled constant speed if possible. The cooling process may be performed, preferably, at a speed of about 1° C./sec to about 50° C./sec, most preferably, at a speed of about 10° C./sec.

A typical cooling process that is performed after formation of a layer includes supplying an inert gas or a natural cooling process. However, in the present embodiment, since the generated amount of heat may be controlled by adjusting the amount of current, a cooling speed of the graphite metal layer 220 may be precisely controlled by varying the amount of current, so that high-quality graphene can be grown.

Next, the graphite metal layer 220 is removed using acidic processing so that the graphene thin film 260 can be separated from the substrate 210. In the present embodiment, by sequentially dipping the substrate 210 having the graphene thin film 260 in HF and TFG solutions, the silicon oxide layer 215 and the graphite metal layer 220 are sequentially removed so that the graphene thin film 260 having a sheet shape can be completely separated and extracted from the substrate 210. The graphene thin film 260 separated from the substrate 210 is used as the graphene thin film 20 of the PD 100 shown in FIG. 1.

PD and Method of Fabricating the Same According to Embodiments

1. Method of Fabricating Graphene Thin Film

1) A $SiO_2$ substrate was processed with ultrasonic waves using acetone and ethanol and cleaned using deionized water (DIW). The cleaned substrate was dried using $N_2$ gas, and a Ni thin film was deposited to a thickness of about 200 nm or more on the substrate.

2) The $SiO_2$ substrate on which the Ni thin film was deposited was loaded into the chamber to perform a CVD process, and the chamber was vacuumized by removing the air and filled with a mixture gas obtained by mixing $H_2$ and Ar in a ratio of 1:4 to obtain an atmospheric pressure. By supplying current to the substrate while maintaining the atmospheric pressure, the substrate was heated to a temperature of about 800° C. Afterwards, $CH_4$ gas and the mixture gas of $H_2$ and Ar were respectively injected into the chamber at flow rates of about 50 sccm and 200 sccm for 30 seconds, and the substrate was cooled to an atmospheric temperature at a speed of about 10° C./sec.

3) Graphene was grown on the Ni thin film using the process 2). The substrate on which the graphene was grown was put in a HF solution to etch $SiO_2$. Thereafter, the substrate was put in a TFG solution to etch Ni, thereby finally extracting only a graphene thin film. The extracted graphene thin film had a sheet shape. The graphene thin film was kept in DIW and used for fabrication of a PD.

2. Method of Fabricating ZnO Nanoparticles

1) To dissolve zinc acetate dihydrate ($Zn(CH_3COO)_2H_2O$), which was a precursor of ZnO, zinc acetate dihydrate was mixed with a DMF solution in a ratio of 1 g to 100 mL. In this case, to completely dissolve zinc acetate dihydrate, zinc acetate dihydrate was more uniformly mixed with the DMF solution using an ultrasonic stirrer. Specifically, the mixture solution was uniformly mixed for about 10 minutes using the ultrasonic stirrer.

2) The DMF solution of the process 1) was heated to a temperature of about 105° C. Thereafter, the temperature of the DMF solution was gradually reduced to temperatures of about 80° C., about 60° C., and about 40° C. in sequence. Specifically, the mixture solution was heated at a temperature of about 105° C. for about 5 hours and then maintained for about one hour at each of gradually dropped temperatures, that is, temperatures of about 80° C., about 60° C., and about 40° C.

3) As a result of the process 2), ZnO nanoparticles were formed in the mixture solution. To obtain ZnO nanoparticles having high crystallinity, it is necessary to precisely control the temperature in the process 2).

3. Method of Fabricating a PD

1) A PD was fabricated to have the structure shown in FIG. 1. Initially, the surface of a glass substrate was chemically processed, and the graphene thin film fabricated using the process 1 was disposed on the surface of the glass substrate. The graphene thin film was easily adhered onto the glass substrate due to van der Waals force, and strong adhesive force between the graphene thin film and the glass substrate could be confirmed.

2) The DMF solution in which the ZnO nanoparticles formed in the process 2 were dispersed was spin-coated on the graphene thin film at a speed of about 1000 rpm to about 2000 rpm for about 10 seconds to about 20 seconds. DMF was evaporated by applying heat for about 30 minutes in an oven or hot plate. After evaporating DMF, only ZnO nanoparticles were left, which were tightly fixed onto the graphene thin film due to van der Waals force.

3) The ZnO nanoparticles were removed by etching ZnO nanoparticles from a portion where an electrode region would be formed. Only a graphene thin film was left on the portion from which the nanoparticles were removed, as shown in FIGS. 2 and 3, which functioned as an electrode to be connected to an external circuit.

4) The external circuit was connected as shown in FIG. 1, thereby completing fabrication of a UV PD.

Figure 10:
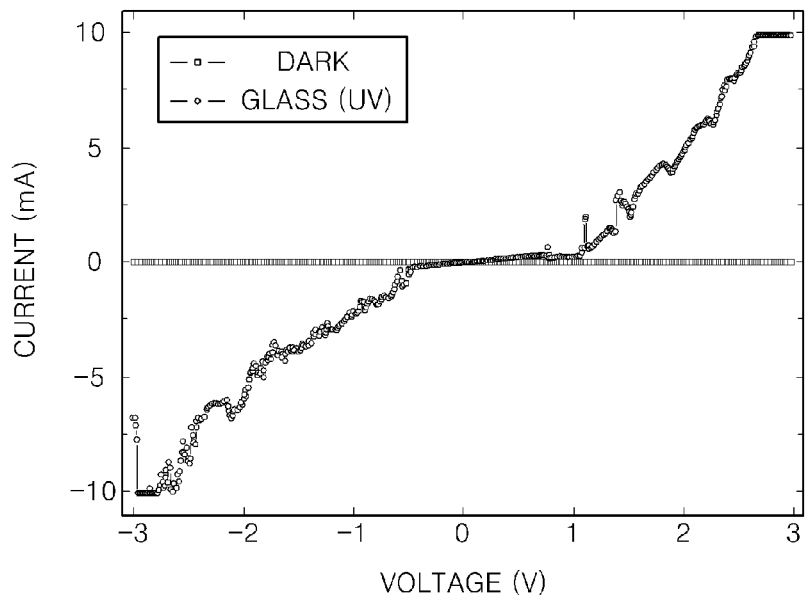
FIGS. 10 and 11 illustrate curves showing current (I)-voltage (V) characteristics of a PD fabricated according to an embodiment of the present invention.

4. Current-Voltage (I-V) Characteristics of a PD Fabricated According to the Embodiment of the Present Invention FIG. 10 illustrates curves showing current (I)-voltage (V) characteristics measured when UV light is not incident (-□-) and when UV light is incident (-○-) in the fabrication of a UV PD using ZnO nanoparticles according to the present invention using a glass substrate, which is an inorganic substance. Referring to FIG. 10, when UV light is not applied, a very small dark current of about several μA is supplied. Thus, it can be seen that when no UV light is applied, a device has a very high resistance.

When UV light is incident to the PD of FIG. 10, current supplied to the device is greatly increased to about 10 mA or more at a voltage of about 3 V. Since the current of about 10 mA or more is larger by $10^4$ or more than when no UV light is applied, it can be seen that the present device may be used as a UV PD. The current of about 10 mA obtained at the voltage of 3 V is much larger than a value obtained using a conventional device using only ZnO nanoparticles. Thus, it can be seen that the UV PD proposed in the present invention may operate at a low voltage.

Figure 11:
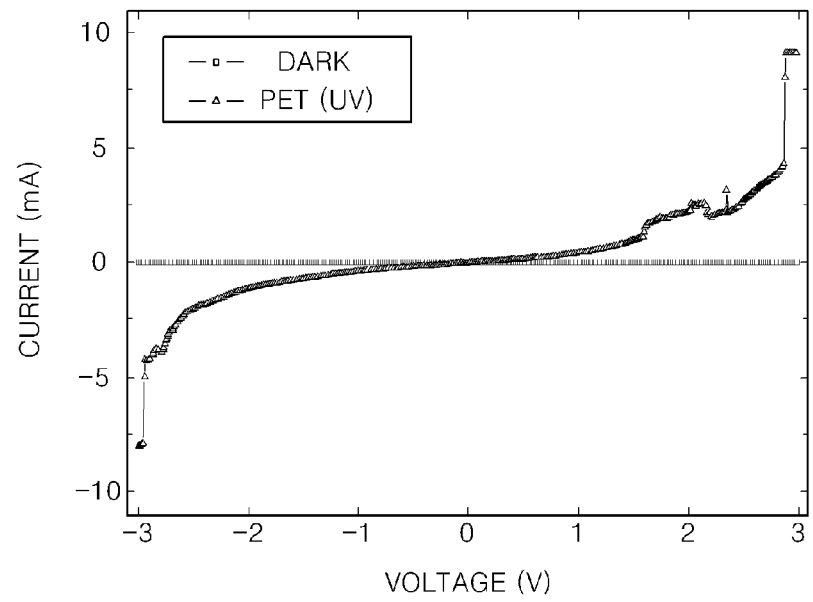

FIG. 11 illustrates curves showing current (I)-voltage (V) characteristics measured in the fabrication of a UV PD using ZnO nanoparticles according to the present invention using a PET substrate, which is an organic substance. It can be seen that when UV light is not applied (-□-), a very small current is supplied as in FIG. 10.

Referring to FIG. 11, when UV light is incident (-Δ-), a large current of several mA or more is supplied to a device. The obtained current of several mA is slightly smaller than current obtained using the device of FIG. 10 because the device of FIG. 10 using the glass substrate is more transparent than the device of FIG. 11 using the PET substrate. However, when the PET substrate is used, the device may be bent, unlike when the glass substrate is used, thereby enabling fabrication of a flexible PD.

5. Operating Principles of the PD Using the Graphene Thin Film Shown in FIG. 1

1) An external power source and a load resistor are connected to the electrode region 30 in the PD 100 shown in FIG. 1.

2) The surface of ZnO nanoparticles 40 typically includes oxygen ions ($O_2$), and an electric field generated by the oxygen ions is formed in the surfaces of the ZnO nanoparticles 40.

Figure 12:
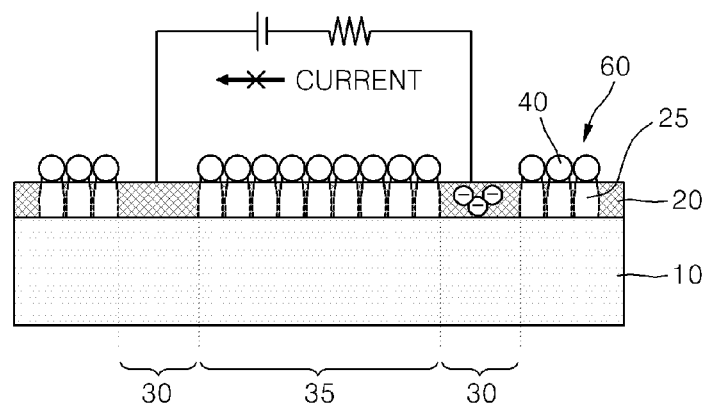
FIGS. 12 and 13 are diagrams for explaining operating principles of a PD fabricated according to an embodiment of the present invention.

3) When UV light is not incident as shown in FIG. 12, an electric field generated by oxygen ions is present in the surfaces of the ZnO nanoparticles 40 of a nanoparticle layer 60 adhered onto the graphene thin film 20. The electric field forms a depletion layer 25 in the graphene thin film 20 as shown in FIG. 12. Since carbon atoms are stacked as a single layer or a double or triple layer and the graphene thin film 20 has a very small thickness, a channel 35 of the graphene thin film 20 is wholly occupied by the depletion layer 25. Thus, as shown in FIG. 12, electrons supplied from an external power source are blocked by the depletion layer 25 and prevented from passing through the channel 35 so that current is hardly supplied to the device.

Figure 13:
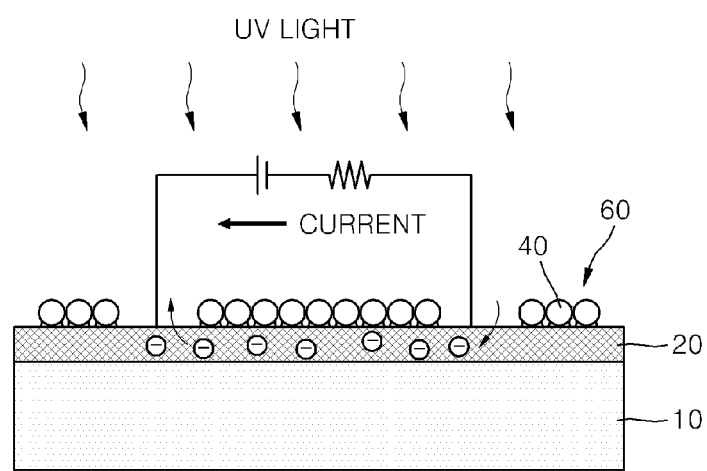

4) When UV light is incident to the device as shown in FIG. 13, the UV light is absorbed by the ZnO nanoparticles. The absorbed UV light form electron-hole pairs in the ZnO nanoparticles 40. Among the electron-hole pairs, holes combine with oxygen ions to convert the oxygen ions into oxygen molecules ($h^+ + O_2^- \rightarrow O_2$). Since the oxygen ions are neutralized, the depletion layer (refer to 25 in FIG. 12) formed in the channel (refer to 35 in FIG. 12) due to the oxygen ions is greatly reduced as shown in FIG. 13, and the electrons may be transported through the channel 35. Accordingly, a large current is supplied to the device and detected by a load resistor so that the device can operate as a PD by determining the presence or absence of UV light.

While the invention has been shown and described with reference to m certain embodiments thereof, it will be understood by those skilled in the art that various changes in form and details may be made therein without departing from the spirit and scope of the invention as defined by the appended claims.

The invention claimed is:

1. A photodetector (PD) comprising:
   a graphene thin film having a sheet shape formed by means of a graphene deposition process using a vapor-phase carbon (C) source; and
   a nanoparticle layer formed on the graphene thin film and patterned to define an electrode region of the graphene thin film, the nanoparticle layer being formed of nanoparticles without a matrix material.

2. The PD of claim 1, wherein the nanoparticles are one selected from the group consisting of zinc oxide (ZnO), copper oxide (CuO), barium carbonate ($BaCO_3$), bismuth oxide ($Bi_2O_3$), boron oxide ($B_2O_3$), calcium carbonate ($CaCO_3$), cerium oxide ($CeO_2$), chromium oxide ($Cr_2O_3$), iron oxide ($Fe_2O_3$), gallium oxide ($Ga_2O_3$), indium oxide ($In_2O_3$), lithium carbonate ($Li_2CO_3$), lithium cobalt oxide ($LiCoO_2$), magnesium oxide (MgO), manganese carbonate ($MnCO_3$), manganese oxide ($MnO_2$), manganese tetroxide ($Mn_3O_4$), niobium oxide ($Nb_2O_5$), lead oxide (PbO), antimony oxide ($Sb_2O_3$), tin oxide ($SnO_2$), strontium carbonate ($SrCO_3$), tantalum oxide ($Ta_2O_5$), titanium oxide ($TiO_2$), barium titanate ($BaTiO_3$), vanadium oxide ($V_2O_5$), tungsten oxide ($WO_3$), zirconium oxide ($ZrO_2$), gallium nitride (GaN), aluminum gallium nitride ($Al_xGa_{1-x}N$), silicon carbide (SiC), and zinc sulfide (ZnS).

3. A method of fabricating a photodetector (PD), comprising:
  forming a graphene thin film by means of a graphene deposition process using a vapor-phase carbon source; and
  forming a nanoparticle layer on the graphene thin film, the nanoparticle layer being patterned to define an electrode region of the graphene thin film and formed of nanoparticles without a matrix material.

4. The method of claim 3, wherein the forming of the nanoparticle layer comprises:
  preparing a solution in which nanoparticles are dispersed;
  spin-coating the solution, in which the nanoparticles are dispersed, on the graphene thin film and drying the solution to form the nanoparticle layer formed of the nanoparticles without the matrix material; and
  patterning the nanoparticle layer to define the electrode region of the graphene thin film.

5. The method of claim 3, wherein the forming of the nanoparticle layer comprises:
  preparing a solution in which nanoparticles are dispersed;
  forming a mask covering the electrode region of the graphene thin film on the graphene thin film;
  spin-coating the solution, in which the nanoparticles are dispersed, on the graphene thin film on which the mask is formed and drying the solution to form the nanoparticle layer formed of the nanoparticles without the matrix material; and
  removing the mask.

6. The method of any one of claim 4, wherein the preparing of the solution in which the nanoparticles are dispersed comprises:
  dissolving a metal acetate dihydrate in N,N-dimethyl formamide (DMF) to form a mixture solution; and
  heating the mixture solution and gradually dropping a heating temperature to form the nanoparticles.

7. The method of claim 6, wherein the nanoparticles are one selected from the group consisting of ZnO, CuO, $BaCO_3$, $Bi_2O_3$, $B_2O_3$, $CaCO_3$, $CeO_2$, $Cr_2O_3$, $Fe_2O_3$, $Ga_2O_3$, $In_2O_3$, $Li_2CO_3$, $LiCoO_2$, MgO, $MnCO_3$, $MnO_2$, $Mn_3O_4$, $Nb_2O_5$, PbO, $Sb_2O_3$, $SnO_2$, $SrCO_3$, $Ta_2O_5$, $TiO_2$, $BaTiO_3$, $V_2O_5$, $WO_3$, and $ZrO_2$.

8. The method of claim 3, wherein the forming of the graphene thin film comprises:
  loading a substrate on which a graphite metal layer is formed, into a chamber; supplying current to at least one of the graphite metal layer and the substrate in the chamber and heating the graphite metal layer with generated electric heat;
  supplying a vapor-phase carbon source into the chamber during the heating of the graphite metal layer to solidly dissolve a carbon component in the graphite metal layer;
  cooling off the graphite metal layer at a controlled speed by controlling an amount of the current to educe graphene from the solidly dissolved carbon component on a surface of the graphite metal layer; and
  removing the graphite metal layer using acidic processing to separate the educed graphene from the substrate.

9. The method of claim 8, wherein the vapor-phase carbon source contains $CH_4$ gas.

10. The method of claim 8, wherein, during the education of the graphene, a cooling speed of the graphite metal layer ranges from about 1° C./sec to about 50° C./sec.

11. The method of any one of claim 5, wherein the preparing of the solution in which the nanoparticles are dispersed comprises:
  dissolving a metal acetate dihydrate in N,N-dimethyl formamide (DMF) to form a mixture solution; and
  heating the mixture solution and gradually dropping a heating temperature to form the nanoparticles.

* * * * *